United States Patent
Zhu et al.

(10) Patent No.: US 9,059,413 B1
(45) Date of Patent: Jun. 16, 2015

(54) BLUE FLUORESCENT ORGANIC MATERIAL AND ORGANIC LIGHT EMITTING DIODE PANEL THEREOF

(71) Applicant: SHENZHEN CHINA STAR OPTOELECTRONICS TECHNOLOGY CO., LTD., Shenzhen (CN)

(72) Inventors: Xu-Hui Zhu, Shenzhen (CN); Liping Wang, Shenzhen (CN); Yan Xia, Shenzhen (CN); Yi-Fan Wang, Shenzhen (CN); Qinghua Zou, Shenzhen (CN)

(73) Assignee: SHENZHEN CHINA STAR OPTOELECTRONICS TECHNOLOGY CO LTD, Shenzhen (CN)

(*) Notice: Subject to any disclaimer, the term of this patent is extended or adjusted under 35 U.S.C. 154(b) by 0 days.

(21) Appl. No.: 14/235,800

(22) PCT Filed: Dec. 23, 2013

(86) PCT No.: PCT/CN2013/090209
§ 371 (c)(1),
(2) Date: Jan. 29, 2014

(51) Int. Cl.
| | | |
|---|---|---|
| H01L 51/54 | (2006.01) |
| C07D 401/10 | (2006.01) |
| C09K 11/06 | (2006.01) |
| H01L 51/56 | (2006.01) |
| H01L 51/00 | (2006.01) |
| H01L 51/50 | (2006.01) |
| H01L 51/52 | (2006.01) |

(52) U.S. Cl.
CPC ........ *H01L 51/0072* (2013.01); *H01L 51/5012* (2013.01); *H01L 51/5203* (2013.01); *H01L 51/5056* (2013.01); *H01L 51/5072* (2013.01); *H01L 51/0058* (2013.01)

(58) Field of Classification Search
USPC .......................................... 546/176
See application file for complete search history.

(56) References Cited

U.S. PATENT DOCUMENTS

| | | | |
|---|---|---|---|
| 2008/0079356 A1* | 4/2008 | Park et al. ...................... 313/504 |
| 2014/0239261 A1* | 8/2014 | Lee et al. ......................... 257/40 |
| 2014/0306190 A1* | 10/2014 | Lee et al. ........................ 257/40 |

FOREIGN PATENT DOCUMENTS

CN 103409133 * 11/2013

OTHER PUBLICATIONS

Koo; Journal of Nanoscience and Nanotechnology, 2013, 13, 1789-1793.*
Ho; Journal of Organometallic Chemistry, 2009, 694, 2735-2749.*
Sun; Journal of Organic Chemistry, 2006, 71, 6281-6284.*
Li; Organic Letters, 2009, 11, 5318-5321.*
Zhao; Organic Electronics, 2008, 9, 649-655.*

* cited by examiner

*Primary Examiner* — John Mabry
*Assistant Examiner* — Daniel Carcanague
(74) *Attorney, Agent, or Firm* — Mark M Friedman

(57) ABSTRACT

A blue fluorescent organic material is provided, which has the structure as formula (I). In the formula (I), R is $C_1$-$C_{20}$ alkyl, $C_1$-$C_{20}$ alkoxyl or $C_1$-$C_{20}$ aryl having a substituent; $Ar_1$ is H, phenyl, polycyclic aromatic group, substituted phenyl or substituted fused ring aryl; $Ar_2$ is a substituent as given in formula (a) or formula (b). The emission efficiency, stability, and color purity of the blue light can be improved with the blue fluorescent organic material of the present invention, so as to achieve the display effect of a full natural color.

11 Claims, 2 Drawing Sheets

BLUE FLUORESCENT ORGANIC MATERIAL AND ORGANIC LIGHT EMITTING DIODE PANEL THEREOF

FIELD OF THE INVENTION

The present invention relates to a blue fluorescent organic material, and particularly relates to a blue fluorescent organic material used for a light emitting layer of an organic light emitting diode panel.

BACKGROUND OF THE INVENTION

Since the small molecular organic metallic complexes "Tris(8-hydroxyquinolinato)aluminium" (Alq3) have been prepared by Tang and VanSlyke to serve as an electron transport layer and the "sandwich-type" light emitting layer of the organic light emitting diodes (OLEDs), the electroluminescent element made of the small molecule by vacuum thermal evaporation to form a film has been successfully applied to the displays of some consumer electronics. To achieve a full-color display, the light emitting material of three primary colors with high color purity, a long life time, and high efficiency is required. However, with respect to green and red light emitting material, the blue fluorescent has a wider band gap which impacts on the injection of the carriers (especially on the injection of the electrons) and the balance of the holes and electrons injection, such that the light emitting efficiency and stability of the blue OLEDs are poorer than that of the green and red OLEDs. To further improve the performance of the OLEDs, the need to develop the blue light emitting materials, especially the deep blue light emitting material, is urgent and noticeable.

In terms of design and preparation of the blue light emitting materials, the progress is great. For example, the earlier U.S. Pat. No. 5,935,721A has disclosed that a blue light emitting compound 9,10-di(naphth-2-yl) anthracene (AND) has a naphthalene group at the 9,9 position of the anthracene based on the anthracene as being the central portion to obtain 3.5 cd/A of luminous efficiency and the chromaticity coordinates at a luminance of 100 cd/cm² is (0.153, 0.228). Also, in the U.S. Pat. No. 5,891,554A in 2004, the blue fluorescent material, having a styrene group as the bridge, and triphenylamine, phenylamine or carbazole aryl as the terminals (such as DSA-Ph, 1-4-di-[4-(N,N-di-phenyl)amino]styryl-benzene), serves as a guest by doping and performs a luminous efficiency of 9.7 cd/A at a current density of 20 mA/cm², but the color coordinates are located on (0.16, 0.32) in the sky blue field. In addition, some of other blue light emitting materials also have great progress.

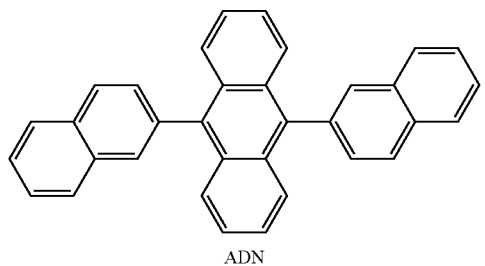

ADN

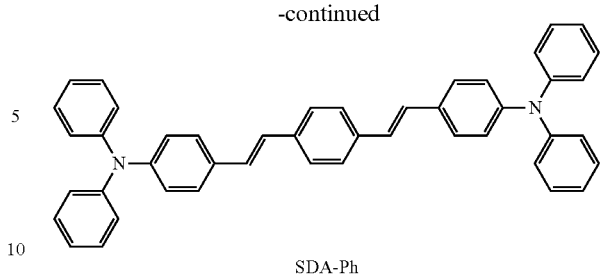

SDA-Ph

Based on these developments, our patent, China patent No. CN 200710031271, discloses a type of blue light emitting material B1 and B2 having asymmetric structures. This type of material has advantages of photoluminescence efficiency in a solid state, high color purity, amorphous properties, good hole-transport properties, and ease of synthesis and purification.

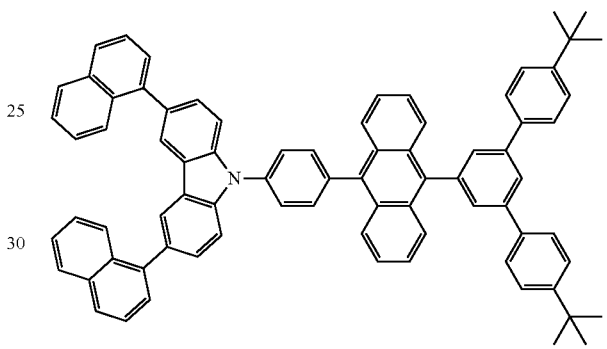

B1

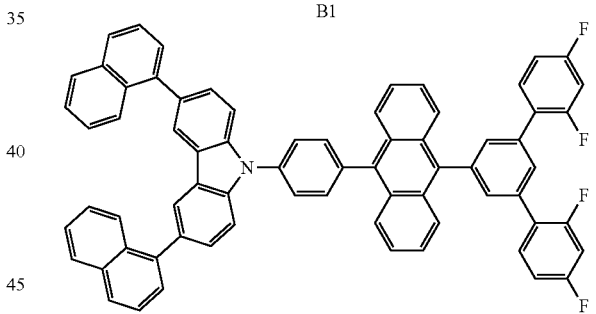

B2

Although the above-mentioned material has advantages, the shortcomings in the electron injection/transport properties of this type of material appear. Therefore, the present invention provides a blue fluorescent organic material having an electron deficient group in the molecular structure to solve the problems existing in conventional technologies and to achieve deep blue color purity in order to provide a full natural color display effect.

SUMMARY OF THE INVENTION

Accordingly, the present invention provides a blue fluorescent organic material with excellent overall performance which possesses light emission efficiency, charge injection/transport characteristics, stability and color purity.

The primary object of the present invention is to provide the above-mentioned blue fluorescent organic material applied to an organic light emitting diode to achieve the full natural color display effect.

To achieve the above object, the present invention provides a blue fluorescent organic material, comprising an organic compound having the structure as given in the following formula (I):

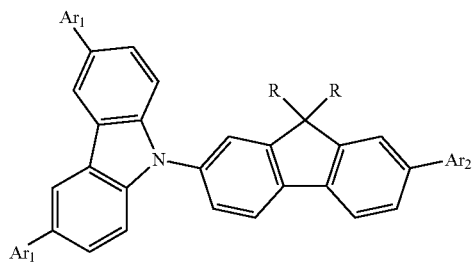

formula (I)

wherein R is $C_1$-$C_{20}$ alkyl, $C_1$-$C_{20}$ alkyoxyl or $C_1$-$C_{20}$ aryl having a substituent; $Ar_1$ is H, phenyl, fused ring aryl, substituted phenyl or substituted fused ring aryl; $Ar_2$ is a substituent as the following formula (a) or (b):

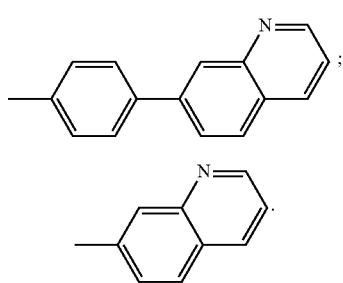

formula (a)

formula (b)

In one embodiment of the present invention, $Ar_1$ comprises a naphthalene ring, an anthracene ring or a phenanthrene ring.

In one embodiment of the present invention, $Ar_1$ is a substituent having the structure as one of the following formula (c), (d), (e) and (f):

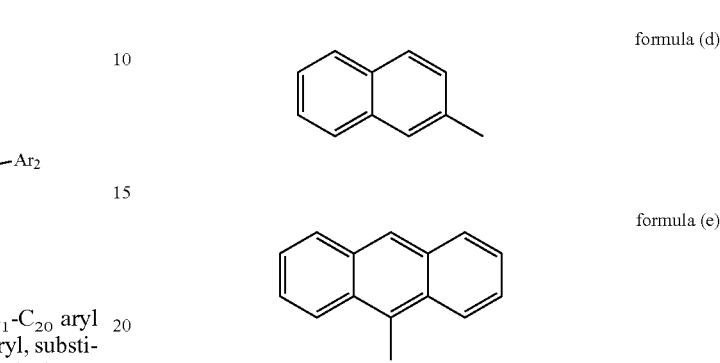

formula (c)

formula (d)

formula (e)

formula (f)

In one embodiment of the present invention, the organic compound has the structure as the following Formula (1) when R is ethyl, $Ar_1$ is the formula (c) and $Ar_2$ is the formula (a):

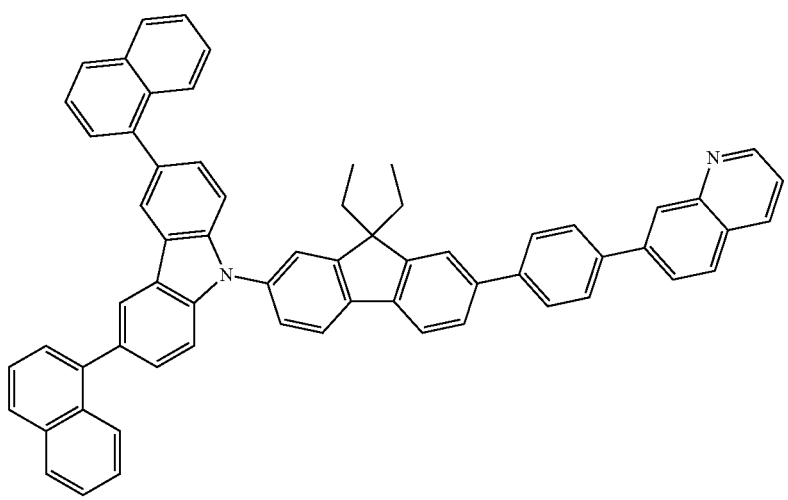

formula (1)

Furthermore, the present invention provides an organic light emitting diode panel, which comprises an upper electrode, a lower electrode, a light emitting layer, and at least one conductive layer. The light emitting layer comprises a blue fluorescent organic material as mentioned above.

In one embodiment of the present invention, the material of the upper electrode is indium tin oxide.

In one embodiment of the present invention, the lower electrode is a metallic cathode.

In one embodiment of the present invention, the conductive layer comprises an electron transport layer or a hole transport layer.

DETAILED DESCRIPTION OF THE PREFERRED EMBODIMENTS

Figure 1:
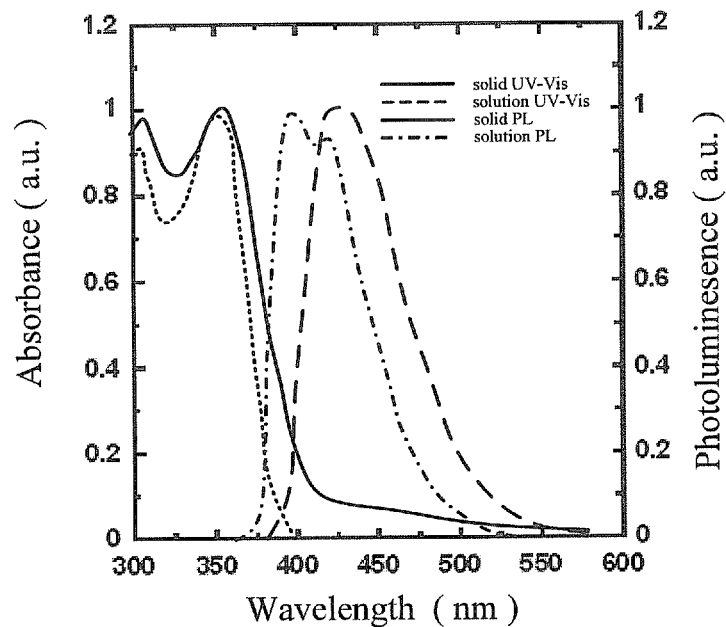
FIG. 1 is the UV-Visible absorption spectrum and the photoluminescence spectrum in a solution of toluene (10-5 mol/L), or in a film, which includes an organic compound as in Formula 1 according to the first embodiment of the present invention.

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto.

The following embodiments are carried out in a general manner if no special instructions are given.

The materials, the reagents, and the equipment used in the following embodiments can be obtained from commercial sources if no special instructions are given.

A blue fluorescent organic material according to the first embodiment of the present invention mainly comprises an organic compound having the structure as given in the following formula (I):

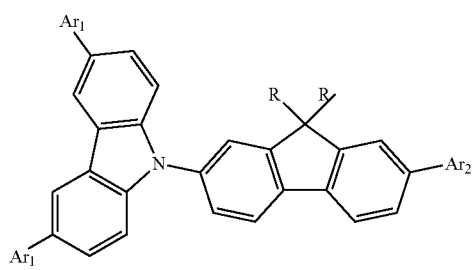

formula (I)

wherein R is $C_1$-$C_{20}$ alkyl, $C_1$-$C_{20}$ alkyoxyl or $C_1$-$C_{20}$ aryl having a substituent; $Ar_1$ is H, phenyl, fused ring aryl, substituted phenyl or substituted fused ring aryl; $Ar_2$ is a substituent as given in the following formula (a) or (b):

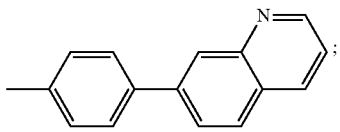

formula (a)

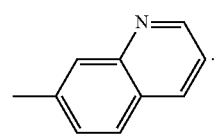

formula (b)

$Ar_1$ comprises a naphthalene ring, an anthracene ring, or a phenanthrene ring, such as a substituent having the structure as given in one of the following formula (c), (d), (e) and (f):

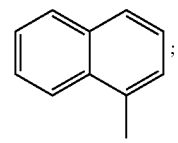

formula (c)

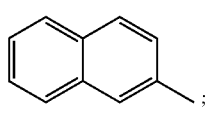

formula (d)

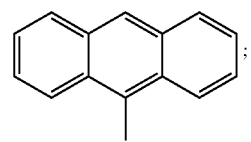

formula (e)

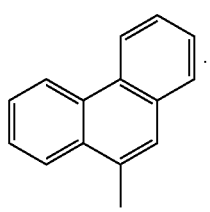

formula (f)

As described above, the organic compound has the structure as given in the following formula (1) when R is ethyl, $Ar_1$ is the formula (c) and $Ar_2$ is the formula (a):

formula (1)

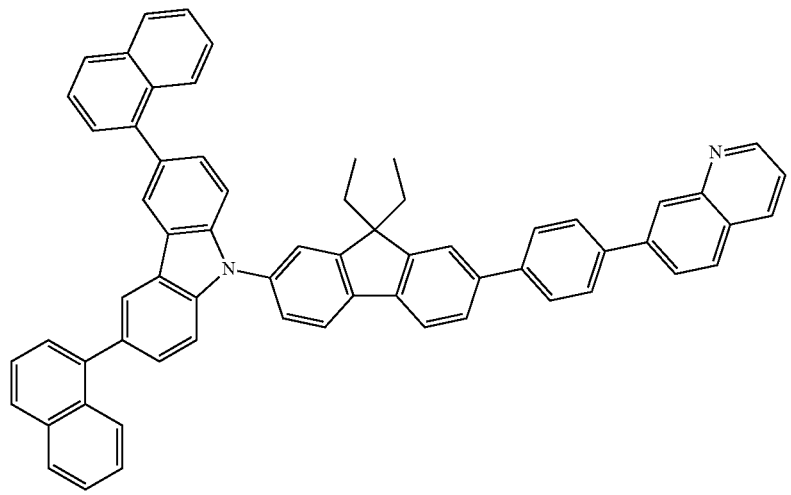

The method for preparing a blue fluorescent organic material as given in formula (I) is described below:

Firstly, 8.12 g (25.0 mmol) of 3,6-dibromo-carbazole and 9.46 g (55.0 mmol) of 1-Naphthylboronic acid are dissolved in 100 ml of toluene, and then an aqueous solution of 30 ml of 2M sodium carbonate ($Na_2CO_3$) and 30.0 ml of ethanol is added to the above-mentioned solution. After the mixed solution is degassed with nitrogen for 30 minutes, 577 mg (0.5 mmol) of tetrakis(triphenylphosphine)palladium (Pd($PPh_3$)$_4$) is added to the solution under nitrogen and then the solution is heated to 90° C. After reacting for 8 hours, the solution is cooled to room temperature, added and stirred with methylene chloride and deionized water. Then, the extracted organic layer is dried with anhydrous magnesium sulfate ($MgSO_4$), and the solvent is removed by reducing the pressure. The remains are passed through the silica gel column with petroleum ether:methylene chloride (V:V)=2:1 to obtain a white solid of 9.3 g (22.2 mmol, 89% yield) of 3,6-bis(1-naphthyl) carbazole. The specific reaction is shown in the reaction formula (1-A):

(1-A)

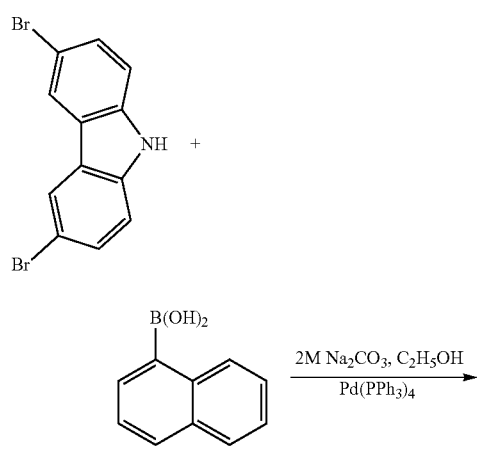

-continued

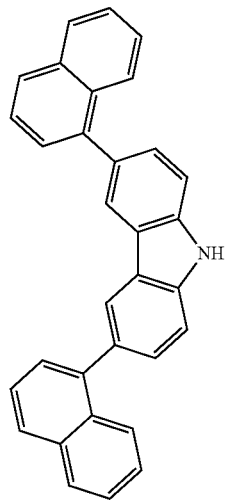

Next, 5.70 g (15.0 mmol) of 2,7-dibromo-9,9-ethyl fluorene and 5.0 g (12.0 mmol) of the above synthesized 3,6-bis(1-naphthyl) carbazole are mixed uniformly and added into 5.0 ml of DMPU (1,3-dimethyl-3,4,5,6-tetrahydropyrimidin-2(1H)-one). Then, 285 mg (1.50 mmol) of copper iodide (CuI), 232 mg (0.88 mmol) of 18-crown-6, and 3.10 g (22.50 mmol) of potassium carbonate ($K_2CO_3$) are added to the mixed solution under nitrogen at 140° C. for 24 hours. The reactants continue reacting till the test of thin layer chromatography (TLC) has no change, and then are cooled to room temperature, and added with methylene chloride and deionized water. The organic layer obtained by extraction is dried by anhydrous magnesium sulfate ($MgSO_4$) and quickly passed through the silica gel short column to remove the solid impurities, then eluted with petroleum ether:dichloromethane (V:V)=4:1 in silica gel column chromatography to obtain 4.57 g (6.4 mmol) of the first intermediate product 9-(2-bromo-9,9-diethylfluorene-7-yl)-3,6-bis(1-naphthyl) carbazole, the yield is 53%. The specific reaction is shown in the reaction formula (1-B):

(1-B)

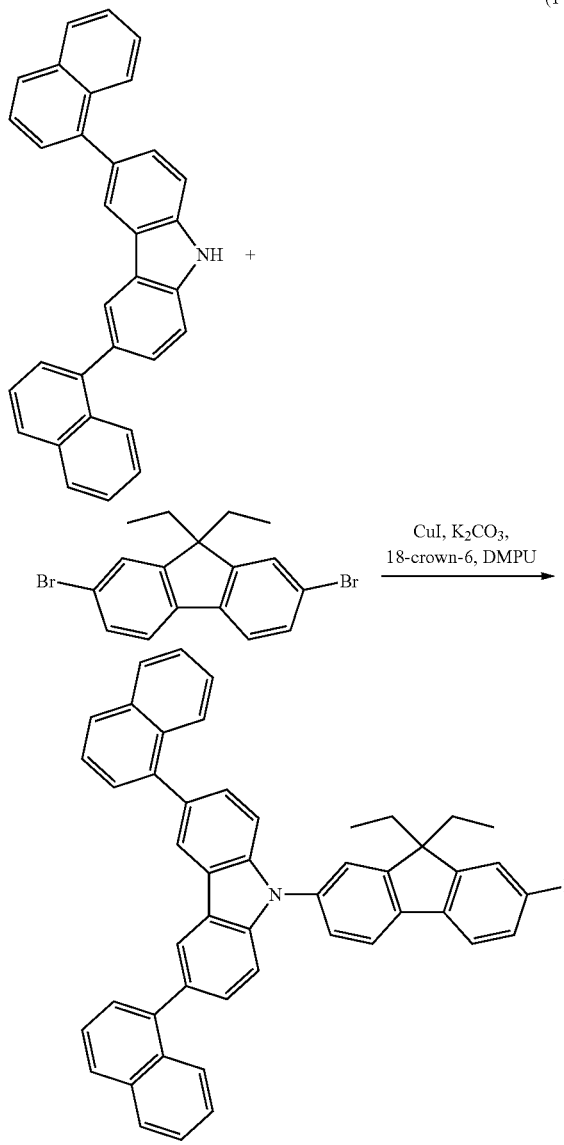

CuI, K₂CO₃,
18-crown-6, DMPU

Subsequently, 2.84 g (10.0 mmol) of 2-(4-bromophenyl)-quinoline, 3.05 g (12.0 mmol) of bis(pinacolato)diboron, 0.3 g (0.12 mmol) of [1,1'-Bis(diphenylphosphino)ferrocene]dichloropalladium (Pd(dppf)Cl₂), and 2.35 g (24.0 mmol) of anhydrous potassium acetate are added to 80 ml of 1,4-dioxane under nitrogen and then the solution is heated to 90° C. After reacting for 4 hours, the solution is cooled to room temperature, added and stirred with methylene chloride and deionized water to be extracted. Then, the extracted organic layer is dried with anhydrous magnesium sulfate (MgSO₄) and concentrated, eluted with petroleum ether:methylene chloride (V:V)=1:1 in silica gel column chromatography to obtain 3.0 g (9.2 mmol) of a second intermediate product (4,4,5,5-tetramethyl-1,3,2-dioxaborolan-4-yl)-phenyl-quinoline in 92% yield. The specific reaction is shown in reaction formula (1-C):

(1-C)

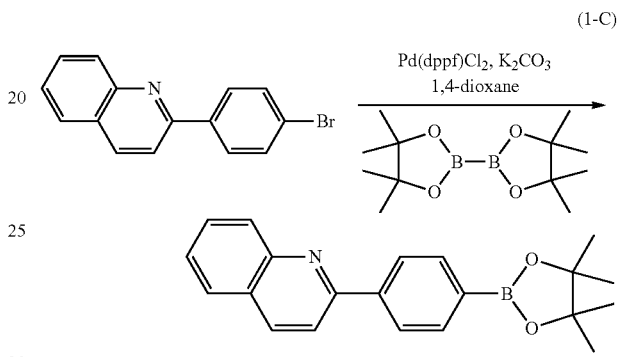

Finally, 208 mg (0.18 mmol) of tetrakis(triphenylphosphine)palladium (Pd(PPh₃)₄) is added to 1.30 g (1.80 mmol) of the first intermediate product 9-(2-bromo-9,9-ethylfluorene-7-yl)-3,6-bis(1-naphthyl) carbazole, 715 mg (2.16 mmol) of the second intermediate product (4,4,5,5-tetramethyl-1,3,2-dioxaborolan-4-yl)-phenyl-quinoline, 4 ml of 2 M sodium carbonate (Na₂CO₃), and 4.0 ml of ethanol, and then the solution is mixed in 30 ml of toluene under nitrogen and heated to 90° C. for 12 hours. Then ethyl acetate and deionized water are added thereto, stirred and extracted. The extracted organic layer is dried with anhydrous magnesium sulfate (MgSO₄) and concentrated. The rough product is eluted with petroleum ether:methylene chloride (V:V)=3:2 to 1:1 in silica gel column chromatography, the product is washed with ethanol to obtain 1.02 g (1.22 mmol) of a pure organic compound as given in formula (1) in 68% yield. The specific reaction is shown in reaction formula as below:

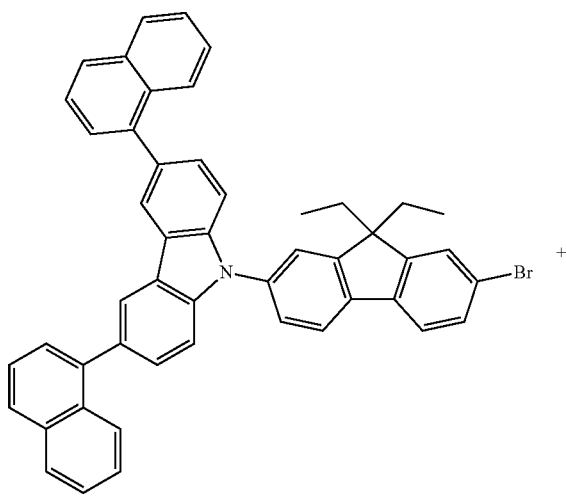

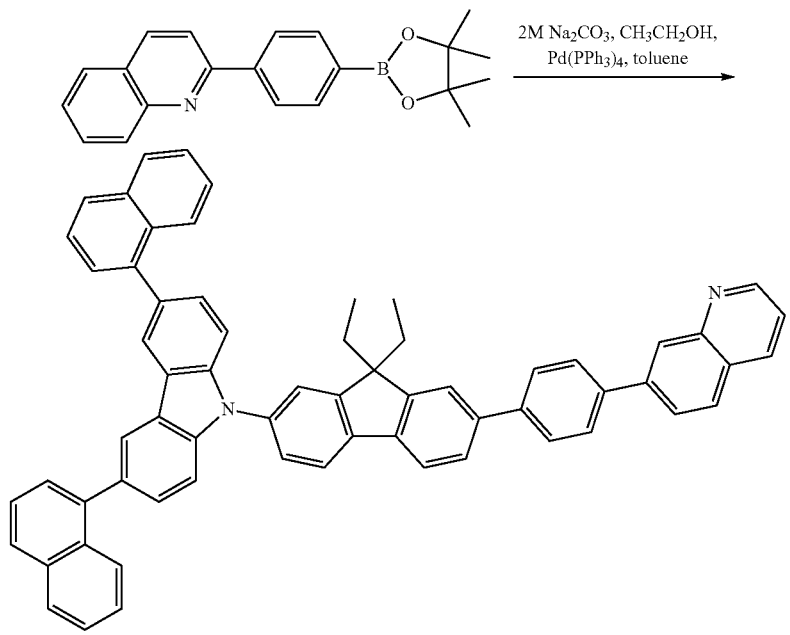

Figure 2:
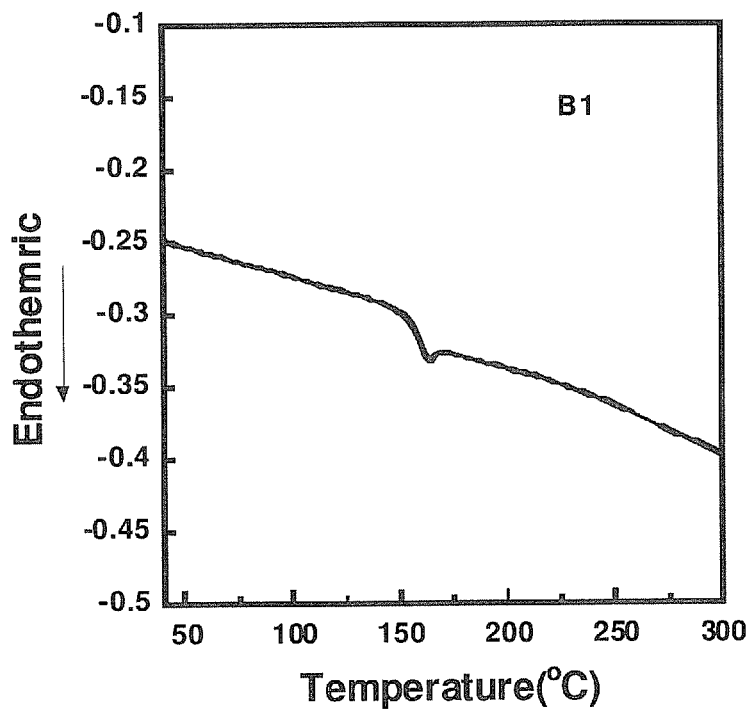
FIG. 2 is a differential scanning calorimetry (DSC) diagram of an organic compound as in Formula 1 according to the first embodiment of the present invention.
Figure 3:
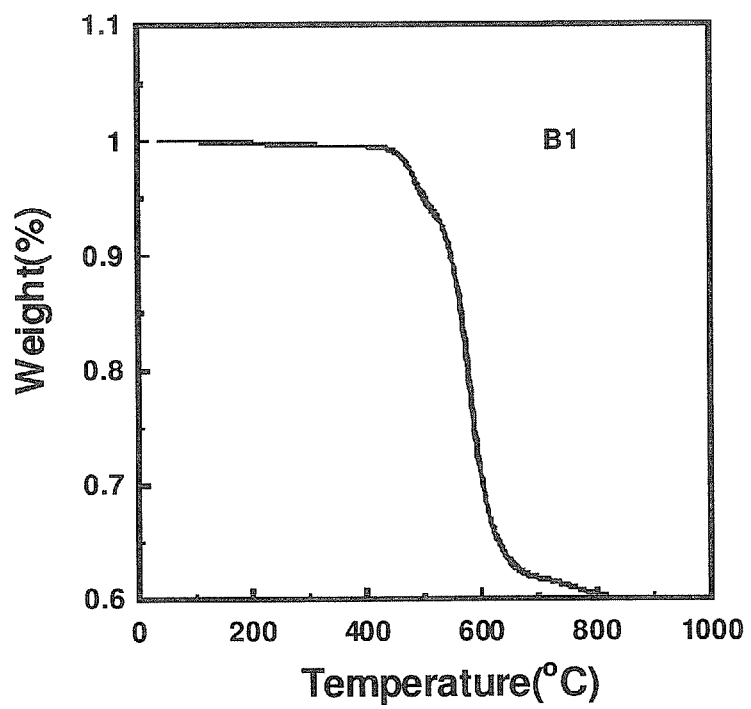
FIG. 3 is a thermogravimetric analysis (TGA) diagram of an organic compound as in Formula 1 according to the first embodiment of the present invention.

Furthermore, the blue fluorescent organic material as formula (1) is tested with the integrating sphere system (330 nm excitation), and the fluorescence quantum efficiency of the film can be measured to be 77.9%. The UV-Visible absorption spectrum and photoluminescence spectrum in toluene and film are located in deep blue light region (for the details please refer to FIG. 1). In addition, the DSC (differential scanning calorimetry) of the organic compounds as given in Formula 1 shows that the compound is amorphous and the glass transition temperature is 150° C. (for the details please refer to FIG. 2). The thermogravimetric analysis (TGA) of the organic compound as given in Formula 1 indicates that it has a higher thermal decomposition temperature which exceeds 400° C., as shown in FIG. 3.

Figure 4:
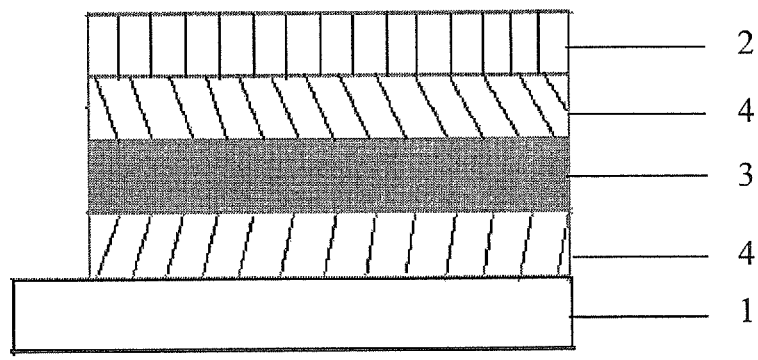
FIG. 4 is a schematic view of an organic light emitting diode panel using an organic compound as in Formula 1 according to the second embodiment of the present invention.

Referring now to FIG. 4, an organic light emitting diode panel according to the second embodiment of the present invention is illustrated, and includes an upper electrode 1, a lower electrode 2, a light emitting layer 3 and at least one conductive layer 4, wherein the light emitting layer comprises a blue fluorescent organic material as described above. The upper electrode 1 can be made of indium tin oxide (ITO) having semiconductor characteristics, the lower electrode 2 is a metallic cathode, and the conductive layer 4 can be an electron transport layer or a hole transport layer. The light emitting layer 3 and the conductive layer 4 can be stacked between the upper electrode 1 and the lower electrode 2 to form a sandwich structure. The light emitting layer formed with the blue fluorescent organic material is able to emit deep blue light so that the organic light emitting diode panel can perform a display effect close to full natural color.

In summary, a blue fluorescent organic material according to the present invention has the advantages stated below:

(1) the method of synthesis is simple, the raw materials are economical and mass production is easy;

(2) the fluorescence efficiency of the thin film is high, so that the fluorescence quenching can be effectively suppressed;

(3) the blue fluorescent organic material has a Donor-Acceptor (electron donor-electron acceptor) structure, in which the molecular structure contains both an electron accepting unit and an electron giving unit good for the balance of the carrier transport; and (4) the blue fluorescent organic material can form an amorphous state so that the amorphous film having a high glass transition temperature can be obtained, and the thermal decomposition temperature thereof is high.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A blue fluorescent organic material, comprising an organic compound having a structure as given in the following formula (I):

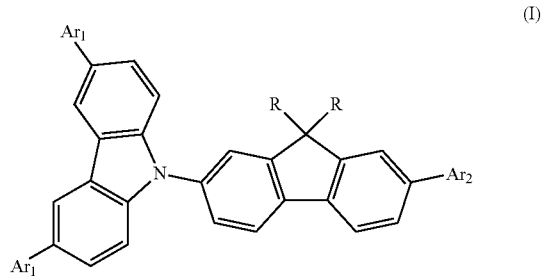

wherein R is $C_1$-$C_{20}$ alkyl; $Ar_1$ comprises a naphthalene ring, an anthracene ring or a phenanthrene ring; $Ar_2$ is a substituent having a structure as given in formula (a):

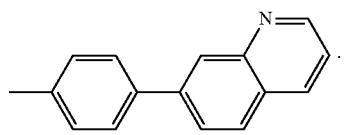

2. The blue fluorescent organic material according to claim 1, wherein R is ethyl or octyl.

3. The blue fluorescent organic material according to claim 2, wherein each Ar$_1$ is a substituent having a structure as given in one of the following formula (c), (d), (e) and (f):

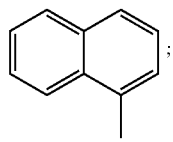

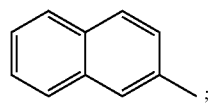

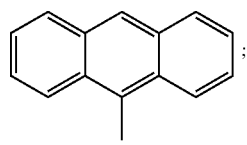

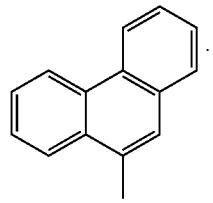

4. A blue fluorescent organic material, comprising an organic compound having a structure, as given in the following formula (I):

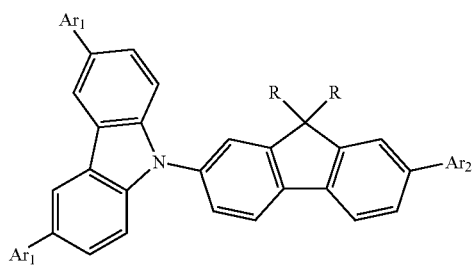

wherein R is $C_1$-$C_{20}$ alkyl, $C_1$-$C_{20}$ alkyoxyl or $C_1$-$C_{20}$ aryl having a substituent; Ar$_1$ is phenyl, fused ring aryl, substituted phenyl or substituted fused ring aryl; Ar$_2$ is a substituent having a structure as given in the following formula (a):

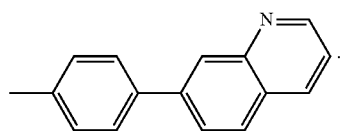

5. The blue fluorescent organic material according to claim 4, wherein Ar$_1$ comprises a naphthalene ring, an anthracene ring or a phenanthrene ring.

6. The blue fluorescent organic material according to claim 5, wherein Ar$_1$ is a substituent having a structure as given in one of the following formula (c), (d), (e) and (f):

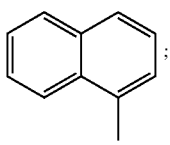

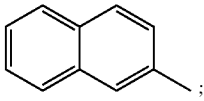

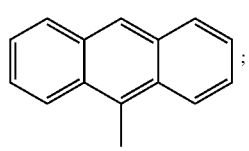

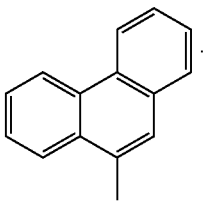

7. The blue fluorescent organic material according to claim 6, wherein the organic compound has a structure as given in the following formula (1) when R is ethyl, each Ar$_1$ is the formula (c) and Ar$_2$ is the formula (a):

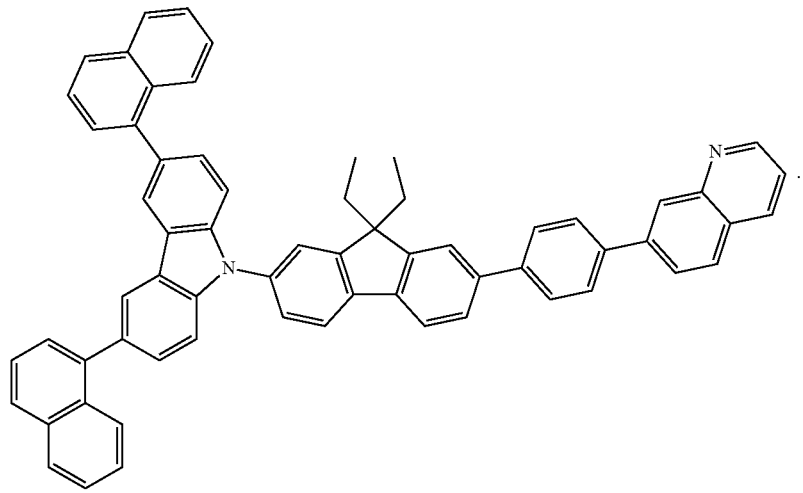

(1)

8. An organic light emitting diode panel, comprising:
an upper electrode;
a lower electrode;
a light emitting layer; and
at least one conductive layer,
wherein the light emitting layer comprises a blue fluorescent organic material according to claim 4.

9. The organic light emitting diode panel according to claim 8, wherein the material of the upper electrode is indium tin oxide.

10. The organic light emitting diode panel according to claim 8, wherein the lower electrode is a metallic cathode.

11. The organic light emitting diode panel according to claim 8, wherein the conductive layer comprises an electron transport layer or a hole transport layer.

* * * * *